United States Patent [19]

Gillery et al.

[11] Patent Number: 4,744,880
[45] Date of Patent: May 17, 1988

[54] ANODE FOR MAGNETIC SPUTTERING OF GRADIENT FILMS

[75] Inventors: F. Howard Gillery, Allison Park; Russell C. Criss, Pittsburgh, both of Pa.

[73] Assignee: PPG Industries, Inc., Pittsburgh, Pa.

[21] Appl. No.: 661,748

[22] Filed: Oct. 17, 1984

Related U.S. Application Data

[63] Continuation-in-part of Ser. No. 571,406, Jan. 17, 1984, Pat. No. 4,478,702.

[51] Int. Cl.$^4$ ............................................. C23C 14/34
[52] U.S. Cl. .............................. 204/298; 204/192.12
[58] Field of Search ............... 204/298, 192 R, 192 E, 204/192 M, 192.1, 192.12

[56] References Cited

U.S. PATENT DOCUMENTS

| 4,407,709 | 10/1983 | Enjouji et al. | 204/298 X |
| 4,414,087 | 11/1983 | Meckel | 204/298 X |
| 4,428,809 | 1/1984 | Heimbach et al. | 204/298 X |
| 4,431,505 | 2/1984 | Morrison, Jr. | 204/298 X |
| 4,478,702 | 10/1984 | Gillery et al. | 204/298 |

OTHER PUBLICATIONS

Maissel et al., "Handbook of Thin Film Technology", McGraw-Hill Book Co., N.Y., 1970, pp. 4-13 to 4-20.

Primary Examiner—John F. Niebling
Assistant Examiner—Nam X. Nguyen
Attorney, Agent, or Firm—Donna L. Seidel

[57] ABSTRACT

An improved anode system for producing uniform gradient coatings by magnetic sputtering is disclosed, comprising a pair of anode plates asymmetrically designed and positioned along the length of the cathode.

6 Claims, 1 Drawing Sheet

ANODE FOR MAGNETIC SPUTTERING OF GRADIENT FILMS

CROSS-REFERENCE

This application is a continuation-in-part of U.S. Ser. No. 571,406 filed Jan. 17, 1984 by the same inventors, entitled "Anode For Magnetic Sputtering Apparatus", now U.S. Pat. No. 4,478,702.

BACKGROUND OF THE INVENTION

This invention relates generally to the art of magnetic sputtering, and more particularly to the art of anode designs for magnetic sputtering.

U.S. Pat. No. 4,166,018 to Chapin describes a sputtering apparatus in which a magnetic field is formed adjacent a planar sputtering surface, the field comprising arching lines of flux over a closed loop erosion region on the sputtering surface. Chapin teaches that the configuration of the anode is relatively unimportant, but it is preferred that the anode be of relatively small size compared to the cathode surface. In the illustrated embodiment, the anode comprises a bar of relatively small cross-section which extends around the cathode spaced from its perimeter.

In prior art literature on magnetic sputtering, the design of the anode system is typically either ignored or dismissed as relatively unimportant. However, it is disclosed in U.S. Pat. No. 4,478,702 to Gillery et al that appropriate anode design is essential to attaining very uniform sputtered films, particularly in reactive sputtering processes, and most especially when depositing insulating layers, such as titanium oxide.

SUMMARY OF THE INVENTION

The present invention involves an anode system designed to provide a thickness gradient in a sputtered film across and along a substrate surface. The anode system of the present invention is particularly well designed for use with an elongated rectangular cathode of the type typically used in a scanning magnetron sputtering coating apparatus. The anode system of the present invention may comprise a single anode, but generally comprises two separate anode plates disposed on opposite sides of the cathode or on opposite sides of the substrate. The configuration of the anodes is very important. The length of the anode is determined by the pattern of coating desired. The width of the anode is less important, but is preferably substantilly less than the length, since the effectiveness of the anode diminishes with distance from the cathode. The thickness of the anode is preferably minimal. An elongated strip of metal of the desired configuration provides a particularly suitable anode plate.

In a preferred embodiment of the present invention, anode systems are shaped to provide coatings with uniform graidents of thickness deposited with either stationary or scanning cathodes. This feature of the present invention is of particular importance in the sputtering of electroconductive materials, which as, result, can be deposited as films with gradient conductivity.

DETAILED DESCRIPTION OF THE PREFERRED EMBODIMENTS

Figure 1:
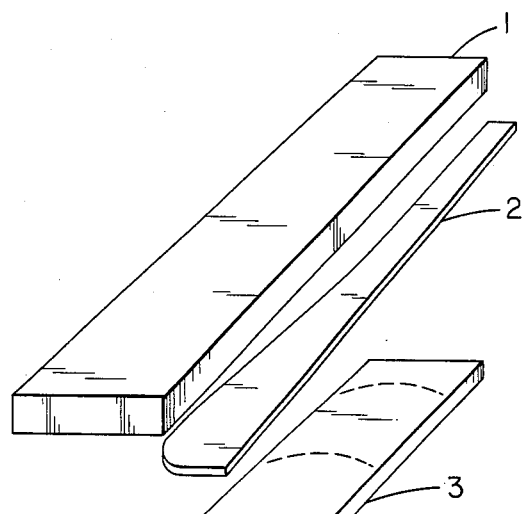
FIG. 1 illustrates an elongated rectangular cathode 1 with a single elongated shaped anode 2 positioned about the substrate 3. The pattern of gradient coating obtained is shown on the surface of substrate 3 with broken lines.

In a typical commercially available magnetic sputtering coating apparatus, the anode supplied consists of an elongated loop of copper tubing disposed on one side of an elongated rectangular cathode. In operation, this system deposits a coating of extremely poor uniformity. For example, when sputtering a titanium oxide film from a titanium metal cathode 40 inches (1 meter) long and 6 inches (15 centimeters) wide scanning over a distance of 24 inches (61 centimeters) at a distance of 3 inches (7.6 centimeters) from the substrate in an atmosphere of 13 percent oxygen in argon at an average current density of 0.0625 amps per square inch (0.0097 amps per square centimeter), the thickness of the coating varies by 30 percent. Typically, a thick band of coating is formed in the center.

In the development of the present invention, it was deduced from a series of experiments that as electrons leave the face of the cathode and travel in the magnetic tunnel created by the magnetic field developed by the sputtering apparatus, they begin to lose energy and are attracted to the anode. As a result, it was discovered, the shape of the anode and its proximity to the magnetic tunnel tend to affect the current flow along the cathode, thereby determine the rate of deposition of the coating, and ultimately control the film thickness.

The anode designs of the present invention provide for the deposition of a desired gradient film. The anode designs in accordance with the present invention may comprise either a single anode or a pair of anodes disposed on opposite sides of a cathode, or positioned adjacent the substrate. The effective surfaces of the anodes may be parallel with the sputtering surface of the cathode, or tangentially spaced from the major dimension of the glow discharge area.

Figure 2:
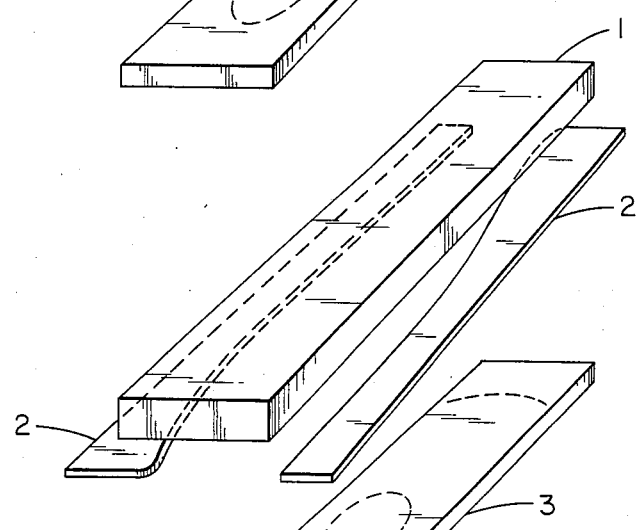
FIG. 2 illustrates an elongated rectangular cathode 1 with a pair of elongated shaped anodes 2 positioned on opposite sides of the cathode 1 above substrate 3. The pattern of gradient coating is shown on the surface of substrate 3 with broken lines.

In one preferred embodiment of the present invention, a pair of shaped anodes 2 is disposed on opposite sides of a substrate as in FIG. 2. The effective surfaces of the anodes are the top surfaces which are parallel, in fact essentially coplanar, with the sputtering surface of the scanning cathode. The anode plates are typically strips of copper metal, preferably water-cooled. The length of the anodes is substantially equal to the parallel dimension of the substrate surface on which the thickest area of coating is to be deposited. The width is less important, since the effectiveness of the anode surface decreases with distance from the cathode. The thickness of the anodes is even less important, and may be minimal. Elongated strips of metal, preferably copper, provide particularly suitable anodes.

When the anode design described above is used in the deposition of titanium oxide from a titanium metal cathode, the effective surfaces of the anodes tend to lose efficiency as they become coated with a insulating layer of titanium oxide which is scattered back from the substrate surface onto the anode surfaces. For this reason, a more preferred embodiment of the present invention is an anode design wherein a pair of elongated shaped anodes is disposed on opposite sides of an elongated rectangular cathode. The anodes may be spaced laterally from the cathode, but are preferably also vertically displaced, typically by about 1.5 inches (about 3.8 centimeters). In this embodiment, the upper surfaces of the anode are the effective surfaces. Although sputtered material will eventually be deposited on the top surface of the anodes as well as the bottom surfaces, the effective upper surfaces will be coated with titanium oxide in a more reduced, and thus more conductive, state, and will therefore not decrease in efficiency as quickly.

In accordance with the present invention, an asymmetrical anode design is required in order to form a coating of gradient thickness. Asymmetry with respect to both the major and minor axes of the sputtering surface is preferred. Although the present invention has been discussed in detail above with respect to a titanium cathode, copper anodes and a scanning apparatus, various other target materials, such as indium, may be used, as well as other anode metals and configurations. Either scanning or stationary cathodes may be used to produce gradient coatings. The present invention will be further understood from the description of the specific examples which follow.

EXAMPLE I

A stationary titanium cathode with a sputtering surface measuring 6 by 40 inches (15 by 102 centimeters) is spaced about 3 inches (about 7.6 centimeters) from a glass substrate having approximately the same dimensions. A single copper anode shaped and positioned as illustrated in FIG. 1 is used in this example. The cathode is sputtered at an average current density of 0.0625 amps per square inch (0.0097 amps per square centimeter) for about 5 minutes in an atmosphere of 13 percent oxygen in argon at a pressure of $6 \times 10^{-4}$ Torr. The resultant titanium oxide coating has a thickness pattern as shown by the dotted lines in FIG. 1. The thickest area of coating in the smaller ellipse has a thickness of about 2700 Angstroms. The thickness of the coating gradiently decreases outwardly such at the area depicted by the larger ellipse, the coating has a thickness of about 2000 Angstroms. The curved broken lines represent coating areas having thicknesses of about 1400 and 700 Angstroms respectively.

EXAMPLE II

A stationary cathode is sputtered to coat a glass substrate with titanium oxide as in Example I except that a pair of copper anodes shaped and positioned as in FIG. 2 is employed. A titanium oxide coating with a uniform thickness gradient is produced. The thickest portion of the coating, as illustrated by the central ellipse in FIG. 2, has a thickness of about 2700 Angstroms. The coating thickness decreases gradually toward the perimeter of the substrate. In the area shown by the curved lines in FIG. 2, the coating has a thickness of about 1400 Angstroms.

The above examples are offered only to illustrate the present invention. Other anode shapes, sizes and positions may be employed to form coatings of other gradient thicknesses. While the examples above employ a stationary cathode, a scanning cathode or moving substrate may be employed to form coatings with bands of gradient thickness. Of course, the cathode, anode and substrate may be comprised of a variety of materials known in the art. The scope of the invention is defined by the following claims.

We claim:

1. In an apparatus for coating a substrate comprising a cathode having a substantially planar surface consisting of a material to be sputtered, magnet means for producing a magnetic field having lines of flux which extend in a curve from said sputtering surface and return thereto to form a magnetic tunnel over a closed loop erosion region on said sputtering surface, an anode positioned to produce an electric field adjacent said sputtering surface for producing a glow discharge confined by said magnetic field to the region adjacent said sputtering surface and within said magnetic tunnel, and means for connecting said cathode and said anode to a source of electrical potential, the improvement which comprises said anode being asymmetrically designed and positioned in relation to said cathode, and spaced from the major dimension of said magnetic tunnel outside the zone of glow discharge confinement, in order to provide a sputtered coating of gradient thickness.

2. The improved apparatus according to claim 1, wherein the cathode is of elongated rectangular shape, and the anode comprises a pair of anode plates positioned on opposite sides of the cathode.

3. The improved apparatus according to claim 2, wherein each anode plate is of elongated shape substantially the same length as the parallel dimension of the substrate surface to be coated with the thickest portion of the gradient coating.

4. The improved apparatus according to claim 3, wherein the effective surfaces of the anode plates are substantially coplanar with the sputtering surface of the cathode.

5. The improved apparatus according to claim 4, wherein the effective surfaces of the anode plates are positioned tangentially spaced from the glow discharge.

6. In a apparatus for coating a substrate comprising a cathode having a substantially planar surface consisting of a material to be sputtered, magnet means for producing a magnetic field having lines of flux which extend in a curve from said sputtering surface and return thereto to form a magnetic tunnel over a closed loop erosion region on said sputtering surface, an anode positioned to produce an electric field adjacent said sputtering surface for producing a glow discharge confined by said magnetic field to the region adjacent said sputtering surface and within said magnetic tunnel, and means for connecting said cathode and said anode to a source of electric potential, the improvement which comprises said anode being asymmetrically designed to produce a gradient sputtered coating.

* * * * *